United States Patent [19]

Kitajima

[11] Patent Number: 5,053,925
[45] Date of Patent: Oct. 1, 1991

[54] ELECTRONIC CIRCUIT UNIT MOUNTING STRUCTURE FOR AN ELECTRONIC EQUIPMENT SUPPORT

[75] Inventor: Yasuhito Kitajima, Tokyo, Japan

[73] Assignee: NEC Corporation, Japan

[21] Appl. No.: 376,679

[22] Filed: Jul. 7, 1989

[30] Foreign Application Priority Data

Jul. 8, 1988 [JP] Japan .................................. 63-168779

[51] Int. Cl.⁵ .............................................. H05K 7/18
[52] U.S. Cl. ...................................... 361/391; 211/41;
312/111; 361/415
[58] Field of Search ......................... 211/41, 186, 187;
312/111, 264, DIG. 33; 439/61, 64, 76;
361/380, 391, 395, 397, 399, 415, 428, 429, 390,
396, 393, 394

[56] References Cited

U.S. PATENT DOCUMENTS

| 4,158,876 | 6/1979 | Pedro | 361/415 |
| 4,179,724 | 12/1979 | Bonhomme | 361/391 |
| 4,193,650 | 3/1980 | Gray | 312/111 |
| 4,277,120 | 7/1981 | Drake | 312/111 |
| 4,353,469 | 10/1982 | Etchison, Jr. | 211/41 |
| 4,531,645 | 7/1985 | Tisbo | 312/DIG. 33 |
| 4,563,722 | 1/1986 | Maroney | 361/415 |
| 4,664,265 | 5/1987 | George, Jr. | 361/415 |

FOREIGN PATENT DOCUMENTS 1315641 6/1973 United Kingdom .
1315642 6/1973 United Kingdom .

OTHER PUBLICATIONS

Farber et al, "Konstruktionsmerkmale der Bauweise 7 R (BW 7 R) Techn. Mitt Aeg-Telefunken" (1974).

Primary Examiner—Gerald P. Tolin
Attorney, Agent, or Firm—Leydig, Voit & Mayer

[57] ABSTRACT

An electronic circuit unit mounting structure for an electronic equipment support allows a number of electronic circuit units consituting electronic equipment to be directly mounted on the support. The structure includes at least on shelf which is loaded with electronic circuit units, and a mother board having a connector which is connectable to connectors of the individual electronic circuit units. One can mount and dismount the mother board and shelf, standing in front of the support.

1 Claim, 3 Drawing Sheets

ELECTRONIC CIRCUIT UNIT MOUNTING STRUCTURE FOR AN ELECTRONIC EQUIPMENT SUPPORT

BACKGROUND OF THE INVENTION

The present invention relates to an electronic circuit unit mounting structure for an electronic equipment support which allows a number of electronic circuit units constituting electronic equipment to be directly mounted on the support.

Communications equipment or similar electronic equipment has been proposed which has a plurality of electronic circuit units each being implemented by a printed circuit board which carries a number of electronic parts therewith. The electronic circuit units are mounted on individual communications equipment casings having substantial mechanical strength, and then loaded one above another on an equipment support. Basically, each casing has a box-like configuration which is formed by mechanically connecting opposite side panels, a top panel, and a bottom panel. A mother board has a connector which mates with connectors of the individual circuit units, while a shelf has guide channels for mounting and holding the circuit units in a predetermined position in the casing. The mother board and shelf are received in the box-like casing. There also has been proposed a communications equipment casing which is configured to mount electronic circuit units on the upper and lower panels in order to reduce the number of structural parts needed. In any case, however, the casing is assembled by interconnecting a plurality of parts by using screws and rivets.

Communication equipment casings of the type described and equipment supports for mounting such casings are disclosed in, for example, British Patent Nos. 1,315,641 and 1,315,642, and "Konstruktionsmerkmale der Bauweise 7R (BW 7R)" by Wilhelm Faber et al, Tech. Mitt. AEG-TELEFUNKEN (1974), Beih, Trgerfrequeztechnik.

As stated above, a communications equipment support has traditionally been regarded as a simple framework for fixing a casing which is loaded with a number of electronic circuit units that constitute communications equipment. Such equipment supports are usually positioned side by side or back-to-back and, hence, the maintenance of communications equipment and the installation of extra equipment should preferably be accomplished only by the manipulations performed in front of the supports. In practice, however, each casing (whose depthwise dimension is 20 centimeters or so) has a substantial weight when loaded with a number of electronic circuit units. It is extremely difficult to fix such a heavy casing surely to the equipment support by manipulating it in front of the support only. Since the structure of the casing as well as the procedure for fixing the casing in place is complicated and since the equipment support itself has to be provided with substantial mechanical strength, the support is disproportionately expensive. Another drawback with the prior art mounting structure is that an extra space is needed for fixing the casing to the equipment support, obstructing efficient equipment loading.

SUMMARY OF THE INVENTION

It is therefore an object of the present invention to provide an electronic circuit unit mounting structure for an electronic equipment support which allows a number of electronic circuit units constituting electronic equipment to be directly mounted on the equipment support.

It is another object of the present invention to provide a generally improved electronic circuit unit mounting structure for an electronic equipment support.

In accordance with the present invention, an electronic circuit unit mounting structure for an electronic equipment support for mounting at least one electronic circuit unit which constitutes electronic equipment and has a connector comprises at least one mother board having a connector connectable to the connector of the electronic circuit unit, and at least one shelf having guide channels for mounting and holding the electronic circuit unit in a predetermined position. The mother board and shelf are mounted on the electronic equipment support from a front end of the support.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
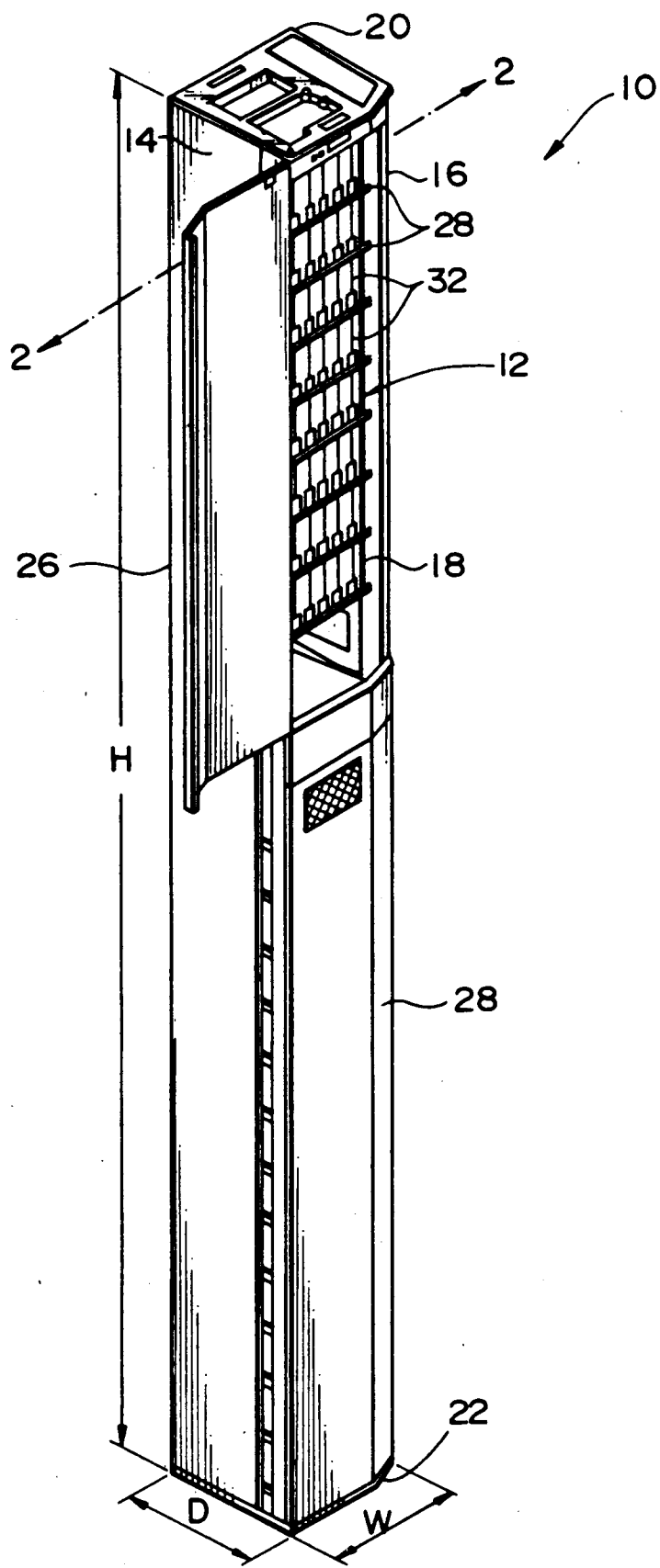
FIG. 1 is a perspective view showing the appearance of an electronic equipment support to which the present invention is applied.

Referring to FIG. 1 of the drawings, an electronic equipment support provided with an electronic circuit unit mounting structure embodying the present invention is shown. In the illustrative embodiment, electronic equipment is implemented as communications equipment by way of example. The equipment support, generally 10, has a width W of 240 millimeters, a depth D of 255 millimeters, and a height H of 2600 millimeters. Communications equipment 12 are securely mounted one above another on the support 10 in order to promote efficient installation in a limited area available in an office. The support 10 has opposite side panels 14 and 16, an inside panel 18, a top frame 20, a bottom frame 22, and a rear panel 24 (see FIGS. 2 and 3) which are securely connected together. Front covers 26 and 28 are hinged to the front end of the support 10 to be rotatable, or openable, about one end thereof. The inside panel 18 is disposed in the support 10. The inside panel 18 defines a circuit unit mounting compartment and a signal cable accommodating compartment in the support 10. In the circuit unit mounting compartment, shelves 30 made of plastic are disposed one above another at a predetermined distance and are individually loaded with electronic circuit units 32. Each shelf 30 has guide channels 30g on opposite major surfaces thereof. A mother board 34 (see FIGS. 2 and 3) is fixed in place on the rear panel 24 of the support 10 and has a connector which is connectable to the individual circuit units 32.

How the mother board 34 and shelves 30 are mounted on the support 10 will be described with reference to FIGS. 2 and 3. Specifically, FIG. 2 is a section of the equipment support 10 along line II—II of FIG. 1 and as viewed from the top, while FIG. 3 is a partly taken-away fragmentary perspective view of the support 10 which is provided with an electronic circuit unit mounting structure embodying the present invention.

Figure 2:
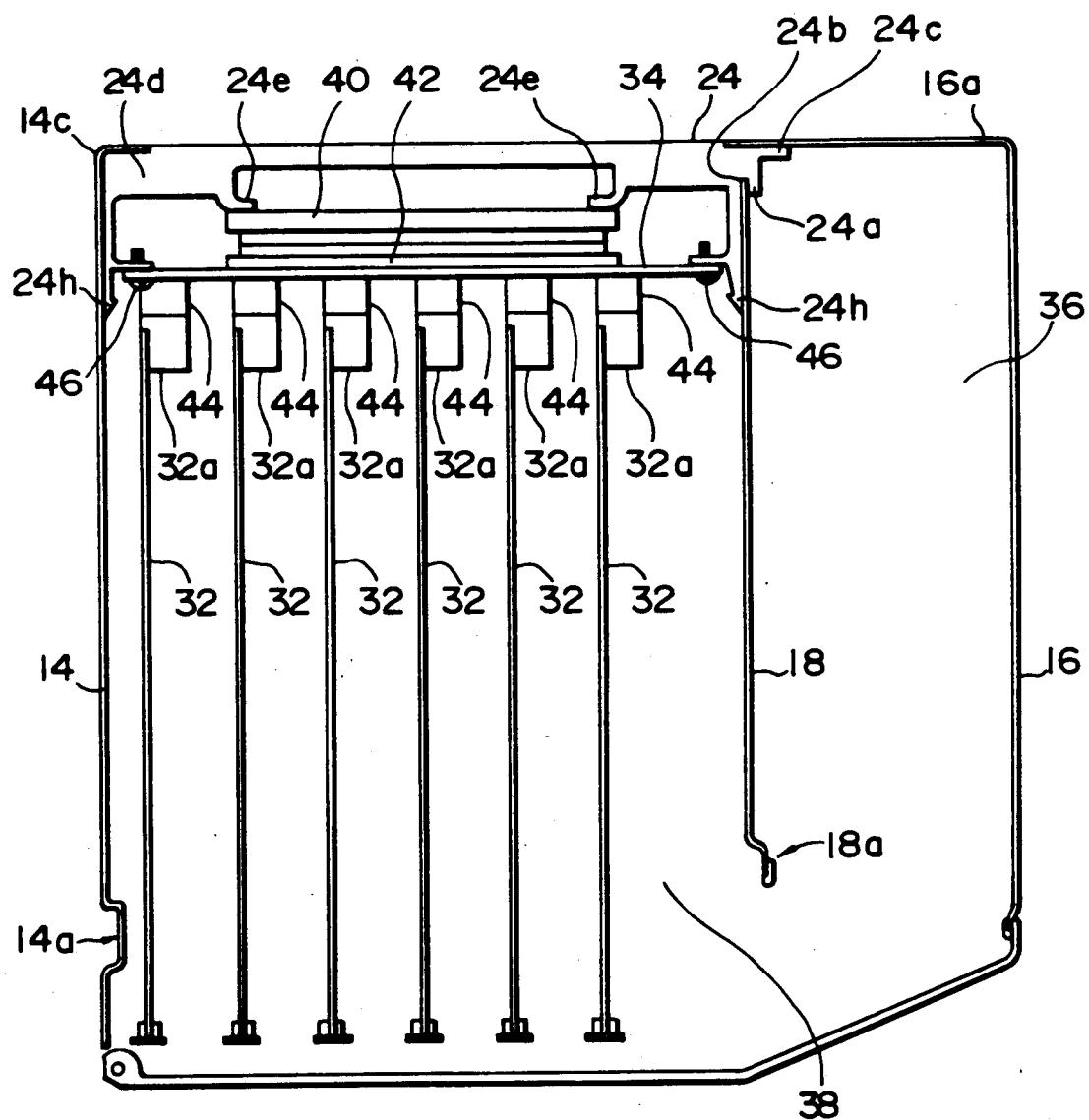
FIG. 2 is a section along line II—II of FIG. 1, showing the equipment support having an electronic circuit unit mounting structure embodying the present invention.
Figure 3:
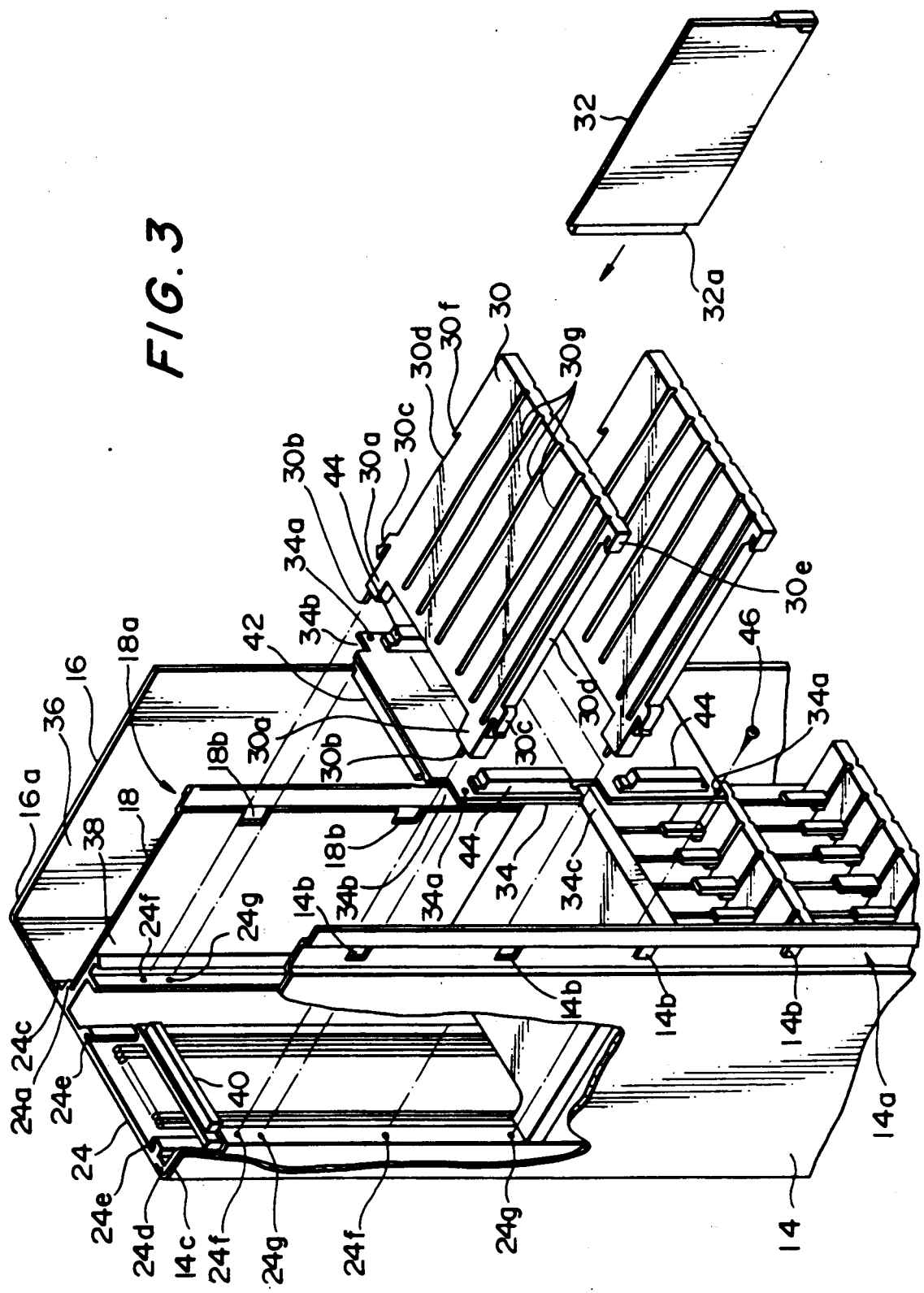
FIG. 3 is a partly taken-way fragmentary perspective view showing the equipment support of FIG. 1 and the embodiment of the present invention more specifically.

In FIGS. 2 and 3, the side panel 14 has a stepped portion 14a at one end and a generally L-shaped portion 14c at the other end. The stepped portion 14a is provided with a number of holes 14b having a particular shape. The inside panel 18 has a stepped portion 18a at on end thereof which is formed with a number of holes 18b whose shape is different from the shape of the holes 14b. The rear panel 24 of the equipment support 10 has a portion 24a for retaining the inside panel 18. Specifically, the portion 24a is provided with a channel 24b which extends along the height of the support 10, and the inside panel 18 is inserted in the channel 24b at one end thereof. The other side panel 16 has a generally L-shaped portion 16a. One end of this portion 16a of the side panel 16 is supported by another portion 24c of the rear panel 24. The side panel 16 and inside panel 18 define therebetween a space 36 which serves as the signal cable accommodating compartment. The L-shaped portion 14c of the side panel 14 is retained by a portion 24d of the rear panel 24. The side panel 14, rear panel 24 and inside panel 18 define a space 38 which serves as the circuit unit mounting compartment. The rear panel 24 further has portions 24e which face the space 38 and on which the connector 40 is securely mounted, a number of holes 24f and 24g, and snap-fit lugs 24h.

The mother board 34 has a connector 42 which mates with the connector 40 mounted on the rear panel 24 as stated above. Each circuit unit 32 has a connector 32a with which the connectors 40 and 42 are mated. Holes 34a are formed through the mother board 34 to mount the mother board 34 on the rear panel 24. Specifically, the mother board 34 is fastened to the rear panel 24 by four tap tight screws 46 which are driven into four holes 24g of the rear panel 24 through the holes 34a. The mother board 34 has generally L-shaped notches 34b and generally U-shaped notches 34c.

Each shelf 30 has a pair of rearward extensions 30a which extend toward the rear panel 24 of the equipment support 10. The extensions 30a are so configured as to pass their associated notches 34b of the mother board 34. Cylindrical lugs 30b protrude from the individual extensions 30a to mate with the holes 24f of the rear panel 24. Snap-fit lugs 30c are positioned on opposite side edges 30d of each shelf 30 in close proximity to the extensions 30a, i.e., in rear portions of the side edges 30d. The snap-fit lugs 30c are individually engageable with the snap-fit lugs 24h of the rear panel 24. Generally L-shaped protuberances 30e and 30f are individually provided on the opposite side edges of each shelf 30 and adjacent to the front end of the latter. The protuberance 30e mates with any of the holes 14b which are formed through the stepped potion 14a of the side panel 14, while the protuberance 30f mates with one of the holes 18b formed through the stepped portion 18a of the inside panel 18 which is aligned with the above hole 14b. The guide channels 30g of the shelf 30 extend in the depthwise direction toward the rear panel 24, so that the individual circuit units 32 may be inserted into the support 10 along the guide channels 30g.

The connector 40 is securely mounted on the rear panel 24 of the equipment support 10 which is formed with the holes 24g for fastening the mother board 34, as stated above. The mother board 34 is fastened to the rear panel 24 by driving the tap tight screws 46 into the holes 24g of the panel 24, the connector 42 of the mother board 34 mating with the connector 40 of the panel 24. When any of the shelves 30 is inserted into and from the front end of the support 10 such that the cylindrical lugs 30b of the shelf 30 mate with the holes 24f of the rear panel 24, the snap-fit lugs 30c of the shelf 30 individually fit with the snap-fit lugs 24h of the rear panel 24 while the protuberances 30e and 30f mate respectively with the holes 14b and 18b of stepped portions 14a and 18a of the side panel 14 and inside panel 18. As a result, the shelf 30 is firmly retained by the rear panel 24, side panel 14, and inside panel 18. Then, an electronic circuit unit 32 is inserted deep into the support 10 along any of the guide channels 30g of the shelf 30 to a position where its connector 32a mates with a connector 44 of the mother board 34.

As described above, in the illustrative embodiment, each shelf 30 made of plastis has the cylindrical lugs 30b at its rear end, snap-fit lugs 30c in rear portions of the opposite side edges, and generally L-shaped protuberances 30e and 30f in front portions of the opposite side edges. The shelf 30 having such a configuration is fixed in place in the circuit unit mounting compartment by mating the lugs 30b and 30c respectively with the holes 24f and lugs 24h of the rear panel 24 and mating the protuberances 30e and 30f respectively with the holes 14b and 18b of the side panel 14 and inside panel 18. The mother board 34 is fastened to the rear panel 24 by driving the screws 46 into the holes 24g of the panel 24. This allows one to mount the mother board 34 and shelves 30 on the equipment support 10 standing in front of the support 10. The circuit unit 32 is inserted into the support 10 along the guide channels 30g which are provided on opposite surfaces of each shelf 30.

In summary, in accordance with the present invention, an equipment support plays the role of the casings of electronic equipment to allow electronic circuit units to be directly mounted on the support, eliminating the need for exclusive casings for the equipment. This noticeably reduces the number of components and structual elements of electronic equipment and, therefore, the number of assembling steps. Further, the electronic equipment become light weight to in turn reduce the mechanical strength required of the entire support, and the structure of the support an the electronic equipment fixing structure are simplified. These in combination contribute a great deal to the cut-down of cost of electronic equipment. In addition, an electronic circuit unit can be mounted merely by fixing a mother board to the support and inserting a shelf into the support, promoting the ease of installation of extra electronic equipment.

Various modifications will become possible for those skilled in the art after receiving the teachings of the present disclosure without departing from the scope thereof.

What is claimed is:

1. A mounting structure for electronic circuit units incorporating electronic equipment and having connectors, said mounting structure comprising:
   a box-like equipment support having opposite vertical side panels, top panel and a bottom panel providing an open front end for access to inside said support, an inside panel parallel to said side panels and a vertical rear panel connected to said side panels at right angles;

a mother board which is secured to said equipment support to extend parallel to said rear panel, said mother board having connectors inside said support facing the front end thereof;

a pair of horizontal shelves secured to said equipment support, said shelves having vertically opposed guide channels extending generally parallel with said side panel; and electronic circuit units held vertically in predetermined positions determined by said opposed guide channels spaced from said side panels said circuit units having connectors which mate with the connectors of said mother board;

one of said side panels having at one end a stepped portion having holes formed therethrough;

said inside panel having at one end a stepped portion which faces said stepped portion of said one side panel and is formed with holes therethrough;

said rear panel further having snap-fit lugs individually engaged with said snap-fit lugs of said rear panel and each of said shelves also having generally L-shaped protuberances engaged with holes of the facing stepped portion, said snap-fit lugs being brought into engagement with the holes as a shelf is inserted inside said equipment support from the front end thereof to secure said shelf to said equipment support.

* * * * *